US008665918B2

(12) United States Patent
Creeden et al.

(10) Patent No.: US 8,665,918 B2
(45) Date of Patent: Mar. 4, 2014

(54) FIBER-BASED WAVELENGTH AGILE VISIBLE LASER SOURCE

(75) Inventors: Daniel Creeden, Nashua, NH (US); Peter A. Budni, Nashua, NH (US); Peter A. Ketteridge, Amherst, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 62 days.

(21) Appl. No.: 12/408,053

(22) Filed: Mar. 20, 2009

(65) Prior Publication Data
US 2010/0238958 A1   Sep. 23, 2010

(51) Int. Cl.
*H01S 3/10*   (2006.01)
(52) U.S. Cl.
USPC ............................. 372/22; 372/21; 372/23
(58) Field of Classification Search
None
See application file for complete search history.

(56) References Cited

U.S. PATENT DOCUMENTS

| | | | | | |
|---|---|---|---|---|---|
| 5,253,259 | A | * | 10/1993 | Yamamoto et al. | 372/22 |
| 5,541,946 | A | * | 7/1996 | Scheps et al. | 372/22 |
| 5,644,584 | A | * | 7/1997 | Nam et al. | 372/20 |
| 5,787,102 | A | * | 7/1998 | Alexander et al. | 372/22 |
| 5,841,570 | A | * | 11/1998 | Velsko | 372/21 |
| 6,009,110 | A | * | 12/1999 | Wiechmann et al. | 372/22 |
| 6,590,698 | B1 | * | 7/2003 | Ohtsuki et al. | 372/22 |
| 2007/0242707 | A1 | * | 10/2007 | Spiekermann et al. | 372/21 |
| 2008/0013163 | A1 | * | 1/2008 | Leonardo et al. | 359/341.31 |
| 2009/0201952 | A1 | * | 8/2009 | Luo et al. | 372/5 |

OTHER PUBLICATIONS

Creeden, Daniel et al., "Compact Fiber-Pumped Terahertz Source Based on Difference Frequency Mixing in ZGP", IEEE Journal of Selected Topics in Quantum Electronics, May/Jun. 2007, pp. 732-737, vol. 13, No. 3.
Creeden, Daniel et al., "Compact, High Average Power, Fiber-Pumped Terahertz Source for Active Real-Time Imaging of Concealed Objects", Optical Society of America, 2007, 6 pages, vol. 15, No. 10.
Creeden, Daniel et al., "Power Scaleable, Fiber Pumped Optical Terahertz Source", Optical Society of America, 2007, 3 pages.
Tu, Shih-Yu et al., "532 nm Pumped Optical Parametric Oscillator Using Periodically-poled Stoichiometric LiTaO3", Optical Society of America, 2005, 3 pages.
Creeden, Daniel et al., "Compact Fiber Pumped Terahertz Source", Proc. of SPIE, 2007,10 pages, vol. 6549.
Creeden, Daniel et al., "Real-Time Terahertz Imaging System for the Detection of Concealed Objects", Optical Society of America, 2007, 3 pages.

* cited by examiner

*Primary Examiner* — Armando Rodriguez
*Assistant Examiner* — Sean Hagan
(74) *Attorney, Agent, or Firm* — Maine Cernota & Rardin; Andrew P. Cernota

(57) ABSTRACT

A system is provided for providing high power, wavelength tunable, laser radiation, the system comprising: a plurality of seeder sources, each the source of the plurality having a different seeder wavelength; a Ytterbium doped amplifier chain, receiving radiation from the plurality of seeder sources and at least one pump source; a second harmonic generator communicating with the Ytterbium doped amplifier chain, the second harmonic generator comprising converting radiation of the seeder wavelength into radiation of a second harmonic wavelength; and wherein the second harmonic generator comprises a crystal having a plurality of grating segments, wherein each grating segment converts radiation of a different wavelength.

17 Claims, 2 Drawing Sheets

FIBER-BASED WAVELENGTH AGILE VISIBLE LASER SOURCE

STATEMENT OF GOVERNMENT INTEREST

The present invention was made under Contract No. W911W6-08-C-0004 awarded by United States Army AATD, and the United States Government has certain rights in this invention.

FIELD OF THE INVENTION

The invention relates to laser systems, and more particularly, to a multiple-wavelength visible laser system.

BACKGROUND OF THE INVENTION

Existing laser technologies which generate visible radiation either only generate a single visible wavelength or generate different visible wavelengths by tuning an optical parametric oscillator. Typically, single wavelength visible sources consist of a laser emitting in the near infrared region (900-1400 nm). This laser source would then be frequency converted to the visible through second harmonic generation in a nonlinear optical material, resulting in a single-wavelength visible laser. Other visible systems consist of a laser source emitting in the near infrared region. This laser is then converted to the visible or to the ultraviolet region by second harmonic generation or third harmonic generation respectively. The harmonic wavelength is then used to pump an optical parametric oscillator which will generate a visible wavelength. This visible wavelength may be tuned by mechanically manipulating the OPO.

What is needed, therefore, are techniques for generating multiple visible wavelengths without the need for moving mechanical parts.

SUMMARY OF THE INVENTION

One embodiment of the present invention provides a system for providing high power, wavelength tunable, laser radiation, the system comprising: a plurality of seeder sources, each the source of the plurality having a different seeder wavelength; a Ytterbium doped amplifier chain, receiving radiation from the plurality of seeder sources and at least one pump source; a second harmonic generator communicating with the Ytterbium doped amplifier chain, the second harmonic generator comprising converting radiation of the seeder wavelength into radiation of a second harmonic wavelength; and wherein the second harmonic generator comprises a crystal having a plurality of grating segments, wherein each grating segment converts radiation of a different wavelength.

Another embodiment of the present invention provides such a system wherein the second harmonic generator is a periodically poled stoichiometric lithium tantalate crystal.

A further embodiment of the present invention provides such a system wherein the second harmonic generator is between about approximately 0.48 microns and 0.56 microns.

Still another embodiment of the present invention provides such a system wherein the second harmonic generator is between about approximately 0.51 microns and 0.54 microns.

A still further embodiment of the present invention provides such a system further comprising an optical parametric oscillator driven by the radiation of a second harmonic wavelength.

Even another embodiment of the present invention provides such a system wherein the optical parametric oscillator is a periodically poled stoichiometric lithium tantalate crystal.

An even further embodiment of the present invention provides such a system wherein the optical parametric oscillator is about approximately 0.56-0.70 microns.

Yet another embodiment of the present invention provides such a system wherein the optical parametric oscillator is about approximately 0.57-0.64 microns.

A yet further embodiment of the present invention provides such a system wherein optical parametric oscillator has a plurality of oscillator grating segments, and sad oscillating grating segments are configured to operate with a set of uniform poling spaces having quasi phase-matched colors matching a spectrum of the radiation of the second harmonic wavelength.

Still yet another embodiment of the present invention provides such a system wherein the optical parametric oscillator comprises a non-linear material.

A still yet further embodiment of the present invention provides such a system wherein the non-linear material is Lithium Niobate.

Even yet another embodiment of the present invention provides such a system wherein the seeder source is selected from a group of seeder sources consisting of diodes, microchip lasers, diode pump solid state lasers, flashlamp pumped solid state lasers, and fiber lasers, An even yet further wherein the second harmonic generator comprises a non-linear material.

Even still yet another embodiment of the present invention provides such a system wherein the non-linear material is Lithium Niobate.

One embodiment of the present invention provides a method for the tuning of a visible light laser, the method comprising: selecting a seed source from a plurality of seed sources the seed source emitting light of a seed wavelength; directing the light of a seed wavelength through an amplifier chain thereby amplifying the light of a seed wavelength; converting the light of a seed wavelength to light of a visible wavelength by passing the light of a seed wavelength through a first segmented non-linear periodic poled crystal.

Another embodiment of the present invention provides such a method further comprising passing light emitted from the first segmented non-linear periodic poled crystal through a second segmented periodic poled crystal.

A further embodiment of the present invention provides such a method wherein the second segmented periodic poled crystal.

Still another embodiment of the present invention provides such a method wherein the second segmented periodic poled crystal comprises lithium tantalate.

A still further embodiment of the present invention provides such a method wherein the first segmented periodic poled crystal comprises lithium tantalate.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
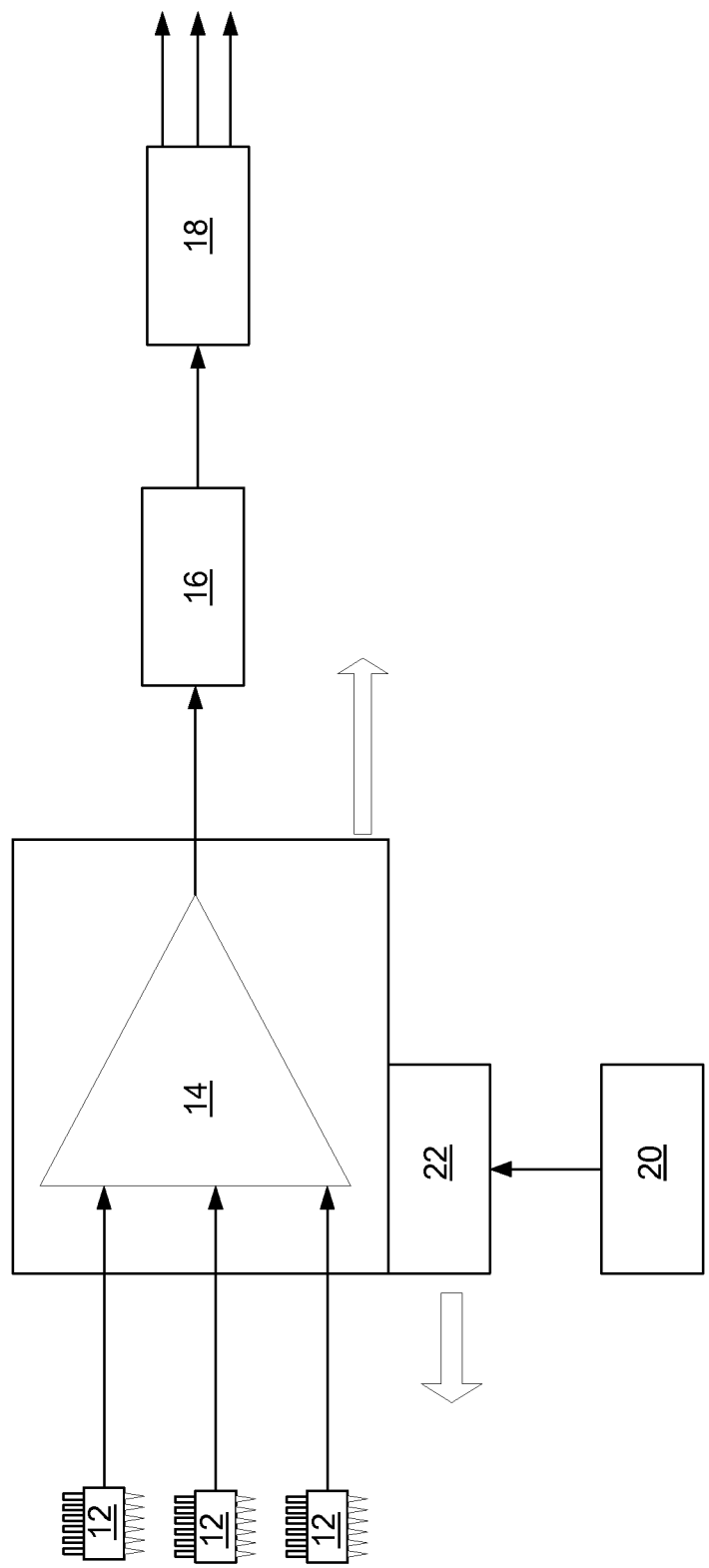
FIG. 1 is a block diagram illustrating a system for providing wavelength tunable laser radiation configured in accordance with one embodiment of the present invention.

One embodiment of the present invention provides a ytterbium doped fiber amplifier system whereby a plurality of seeder sources, such as diodes, microchip lasers, diode pump solid state lasers, flashlamp pumped solid state lasers, and fiber lasers, of different wavelength are amplified. These diodes at One embodiment of the present invention is illustrated in FIG. 1, where a visible channel block diagram is provided illustrating that the wavelength ability achieved by switching between channels at the input to the amplifier stages and driving the converters. A plurality of seeders 12 of various wavelengths are feed in to an amplifier chain 14 comprising a Ytterbium fiber laser. The Ytterbium amplifier chain may also include a power source 20 powering a pump source 22, in one embodiment a pump diode. The Ytterbium fiber laser 14 provides a pulsed power source for first and second Periodically Poled Stoichiometeric Lithium Tantalate (PPSLT) tandem converter modules 16, 18. Other non-linear materials such as Lithium Niobate (LiNbO3) may be substituted for Lithium Tantalate (LiTaO3). Similarly, doping agents, such as Magnesium Oxide, may be introduced to improve the performance of the periodic polled non-linear material. In alternative embodiments, a single periodically poled converter module of non-linear material may be used. The first converter module 16 is configured as a second harmonic generation of about approximately 0.48 and 0.56 microns, and more specifically between about approximately 0.51 microns to 0.54 microns. This converter module 16 drives an optical parametric oscillator 18 of between about approximately 0.56 and 0.70 microns and more specifically about approximately 0.57 and 0.64 microns. Modules 16 and 18 operate in concert and provide wavelength agile visible radiation.

According to such an embodiment of the present invention, the use of a plurality of amplified seeder diodes 12 allows for wavelength agility otherwise difficult or impossible to achieve. Each of the seed diodes 12 has a fixed wavelength, and is amplified within a very broad gain amplifier bandwidth and with high signal gain by the ytterbium amplifier stages 14. Each seeder wavelength is in turn frequency doubled in at least a portion of a segmented PPSLT crystal where the interaction is controlled by the crystal length and grating spacing for each line.

In such an embodiment, the second harmonic generation process is non-linear and has a narrow acceptance bandwidth. As a consequence of the narrow acceptance bandwidth, nearly all incident radiation is converted in a segment, yielding a subsequent Second harmonic generation beam incident to the oscillator 18. The oscillator 18 is equipped with a fixed grating which converts the second harmonic beam to longer wavelength visible light. As noted above, in some embodiments, the oscillator 18 is not necessary, and the beam emitted from the second harmonic generator 16 provides adequate wavelength agility. Firing of the seeders 12 in alternating sequences or ramping the seeders 12 produces a spectral chirp, thereby facilitating wavelength agility. Visible radiation thus emitted comprises residual, Second harmonic, and yellow to red wavelength light generated by the oscillator 18.

Figure 2:
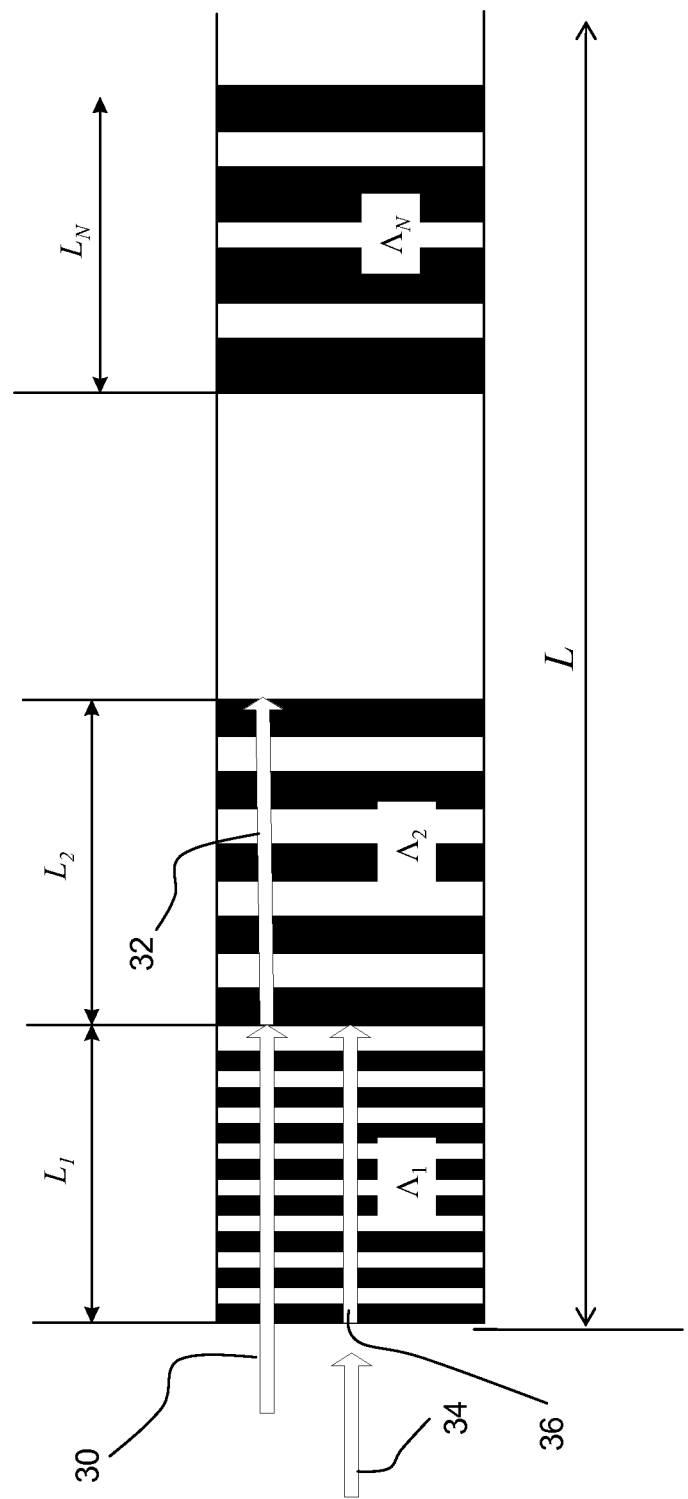
FIG. 2 is a diagram illustrating wavelength conversion within a periodic poled crystal of a system for providing wavelength tunable laser radiation configured in accordance with one embodiment of the present invention.

As illustrated in FIG. 1, to facilitate agile wavelength output, a converter stage is provided which is configured to accept various pump wavelengths and convert radiation of those wavelength into a radiation of a single wavelength. As illustrated in FIG. 2, a segmented second harmonic generator crystal 16 is, in one embodiment, configured to provide a staged architecture whereby only one crystal segment of the staged architecture is accessed by incident radiation of a particular wavelength, thereby maximizing conversion. A periodic polled crystal configured according to one embodiment other present invention, may utilize quasi phase-matched structures by means of a constricted crystal equipped with an interaction grating configured to receive each of wavelength ranges anticipated to be generated and switched through the pump laser at any time.

As illustrated in FIG. 2, a diagram of a segmented system for the production of a Second harmonic generated radiation, itself driving the Oscillator 18 for agile visible mission. An incident beam 30 in one wavelength converts to visible light beam 32 in one grating segment, while passing through other gratings without being affected. A pumping beam 34 is likewise incident to the Second Harmonic Generating crystal, and is converted to a visible light wavelength beam 36 in a different grating segment. In one such embodiment, a segment $\Lambda_1$ may be configured to convert radiation having a wavelength of about approximately 1020 nm to radiation having a wavelength of about approximately 510 nm, while a proximal segment $\Lambda_2$ may be configured to convert radiation having a wavelength of about approximately 1040 nm to radiation having a wavelength of about approximately 520 nm. The periodicity device may be selected for maximum conversion at central wavelengths and de-tuned for other wavelengths of radiation generated by pump or Second harmonic generator 16. De-tuning for these other wavelengths suppresses coherent wave growth for undesirable wavelengths. This suppression of radiation of undesirable wavelengths results in some parametric florescence. Efficiency of the device can thus be tailored and maximized for a desired interaction.

Once the second harmonic color is selected by the amplified seed diode input selection, the second harmonic beam, having high brightness, and tailored temporal and spectral attributed will drive a PPSLT OPO 18. The Oscillator 18 will operate with a set of uniform poling spacing whose quasi-phase matched output colors are chosen to match the desired spectrum combination from the second harmonic generator converter 16.

Segmentation of the poled crystal permits pump color switching of selected colors resulting in broad spectral agility without mechanical movement, thereby facilitating sub millisecond diversity selection.

In an alternative embodiment of the present invention, Ytterbium doped fiber amplification stages may be used prior to non-linear conversion.

One embodiment of the present invention provides a method for the tuning of a visible light laser, the method comprising: selecting a seed source from a plurality of seed sources the seed source emitting light of a seed wavelength; directing the light of a seed wavelength through an amplifier chain thereby amplifying the light of a seed wavelength; converting the light of a seed wavelength to light of a visible wavelength by passing the light of a seed wavelength through a first segmented non-linear periodic poled crystal. In such an embodiment the user may also pass the light emitted from the first segmented non-linear periodic poled crystal through a second segmented periodic poled crystal.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A system for providing high power, wavelength tunable, laser radiation, the system comprising:
   a plurality of seeder sources, each said source of said plurality having a different fixed seeder wavelength;
   a seeder driver for selectively and independently activating a plurality of selected seeder sources in said plurality of seeder sources;
   a Ytterbium doped amplifier chain, receiving radiation from each said selected seeder in said plurality of seeder sources and at least one pump source thereby amplifying radiation from each of said plurality of selected seeder sources;
   a second harmonic generator communicating with said Ytterbium doped amplifier chain, said second harmonic generator comprising converting radiation of each said different seeder wavelength into radiation of a respective second harmonic wavelength; and
   wherein said second harmonic generator comprises a crystal having a plurality of grating segments, each grating segment in said plurality of grating segments being a discrete poling region, wherein each grating segment converts radiation of a specific and different said seeder wavelength;
   optical parametric oscillator of fixed uniform polling spacing driven by said radiation of a second harmonic wavelength and wherein said system is configured to accept laser radiation from more than one said seeder source at a time.

2. The system of claim 1 wherein said second harmonic generator is a periodically poled stoichiometric lithium tantalate crystal.

3. The system of claim 1 wherein said second harmonic wavelength is between about approximately 0.48 microns and 0.56 microns.

4. The system of claim 3 wherein said second harmonic wavelength is between about approximately 0.51 microns and 0.54 microns.

5. The system of claim 1 wherein said optical parametric oscillator is a periodically poled stoichiometric lithium tantalate crystal.

6. The system according to claim 1 wherein said optical parametric oscillator generates a wavelength of about approximately 0.56-0.70 microns.

7. The system according to claim 6 wherein said optical parametric oscillator generates a wavelength of about approximately 0.57-0.64 microns.

8. The system of claim 1 wherein said optical parametric oscillator comprises a non-linear material.

9. The system of claim 8 wherein said non-linear material is Lithium Niobate.

10. The system of claim 1 wherein said seeder source is selected from a group of seeder sources consisting of diodes, microchip lasers, diode pump solid state lasers, flashlamp pumped solid state lasers, and fiber lasers.

11. The system of claim 1 wherein said second harmonic generator comprises a non-linear material.

12. The system of claim 11 wherein said non-linear material is Lithium Niobate.

13. A method for the tuning of a visible light laser, said method comprising:
   Activating independently more than one seed source from a plurality of seed sources each said seed source emitting light of a fixed seed wavelength;
   Directing said light of a seed wavelength corresponding to each activated said seed source through an amplifier chain thereby amplifying said light of each said fixed seed wavelength, thereby amplifying light of more than one said fixed seed wavelength;
   Converting said light of a seed wavelength to light of a visible wavelength by passing said light of a seed wavelength through a first segmented non-linear periodic poled crystal, wherein each segment of said first segmented non-linear periodic poled crystal is a distinct poling region converting light of a different fixed seed wavelength.

14. The method according to claim 13 further comprising passing light emitted from said first segmented non-linear periodic poled crystal through a second segmented periodic poled crystal.

15. The method according to claim 14 wherein said second segmented periodic poled crystal comprises non-linear material.

16. The method according to claim 14 wherein said second segmented periodic poled crystal comprises lithium tantalate.

17. The method according to claim 13 wherein said first segmented periodic poled crystal comprises lithium tantalate.

* * * * *